(12) United States Patent
Delehanty et al.

(10) Patent No.: US 7,214,623 B2
(45) Date of Patent: May 8, 2007

(54) PLANARIZATION SYSTEM AND METHOD USING A CARBONATE CONTAINING FLUID

(75) Inventors: Donald J. Delehanty, Wappingers Falls, NY (US); James W. Hannah, Ossining, NY (US); Daniel M. Heenan, Lagrangeville, NY (US); Fen F. Jamin, Wappingers Falls, NY (US); Laertis Economikos, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 10/605,610

(22) Filed: Oct. 13, 2003

(65) Prior Publication Data

US 2005/0079709 A1    Apr. 14, 2005

(51) Int. Cl.
*H01L 21/302* (2006.01)
(52) U.S. Cl. .............. 438/691; 438/692; 438/693; 51/308; 451/36
(58) Field of Classification Search ................ 438/691
See application file for complete search history.

(56) References Cited

U.S. PATENT DOCUMENTS

| | | | |
|---|---|---|---|
| 5,968,280 A | 10/1999 | Ronay | |
| 6,294,470 B1 | 9/2001 | Economikos et al. | |
| 6,316,365 B1 * | 11/2001 | Wang et al. | 438/692 |
| 6,319,096 B1 | 11/2001 | Mueller et al. | |
| 6,350,692 B1 | 2/2002 | Economikos et al. | |
| 6,358,850 B1 | 3/2002 | Economikos et al. | |
| 6,468,910 B1 | 10/2002 | Srinivasan et al. | |

(Continued)

FOREIGN PATENT DOCUMENTS

| | | |
|---|---|---|
| CN | 1246725 | 3/2000 |
| EP | 0984049 | 3/2000 |

OTHER PUBLICATIONS

Espacenet Family List for CN124675, Oct. 2, 2006.

(Continued)

*Primary Examiner*—Lan Vinh
*Assistant Examiner*—Patricia A. George
(74) *Attorney, Agent, or Firm*—Todd M. C. Li; Daryl Neff

(57) ABSTRACT

Disclosed herein are a system and method of polishing a layer of a substrate. The disclosed method includes providing a polishing apparatus adapted to impart relative movement between a polishing pad and a substrate having a first layer to be polished; providing a liquid medium having a pH between 4 and 11 to an interface between the substrate and the polishing pad, the liquid medium including a pH controlling substance including at least one of an acid and a base, a carbonate and a stabilizer additive comprising at least one selected from the group consisting of amino acids and polyacrylic acid; and moving at least one of the substrate and the polishing pad relative to the other to polish the layer of the substrate.

23 Claims, 3 Drawing Sheets

U.S. PATENT DOCUMENTS

| | | |
|---|---|---|
| 6,485,355 B1 | 11/2002 | Economikos et al. |
| 6,530,826 B2 | 3/2003 | Wenski et al. |
| 6,627,107 B2 | 9/2003 | Srinivasan et al. |
| 6,913,517 B2 * | 7/2005 | Prasad .................... 451/41 |
| 2002/0043026 A1 * | 4/2002 | Luo et al. ................. 51/304 |
| 2002/0094649 A1 | 7/2002 | Arthanari et al. |
| 2003/0219982 A1 * | 11/2003 | Kurata et al. ............. 438/692 |
| 2004/0127045 A1 * | 7/2004 | Gorantla et al. ........... 438/690 |

OTHER PUBLICATIONS

U.S. Appl. No. 60/463,358, entitled "Carbonation of ph controlled KOH solution for improved polishing of oxide films on semiconductor wafers", no date.

* cited by examiner

PLANARIZATION SYSTEM AND METHOD USING A CARBONATE CONTAINING FLUID

BACKGROUND OF INVENTION

The present invention relates to the fabrication of devices having a high degree of integration density, e.g. integrated circuits and/or micro-electromechanical devices (MEMs), among others, and more specifically to an improved system and method of chemically mechanically polishing a substrate on which such devices are fabricated.

Chemical mechanical polishing (CMP) has become an indispensable step in the fabrication of integrated circuits (ICs). In some steps of the fabrication process of ICs, later layers cannot be applied to a semiconductor substrate unless an earlier applied layer presents a planar surface. A CMP process is used to planarize such layers.

In some processes used in IC fabrication, it may be desired to planarize a surface of an oxide layer of a semiconductor substrate. In particular cases, the oxide layer fills spaces between portions of one or more underlying layers of a different material, and only the oxide filled spaces are to remain, as planarized to the underlying layer after polishing to remove the overlying oxide. For example, the oxide layer may fill trenches etched into a semiconductor substrate provided as isolating features, e.g. "shallow trench isolations," and "isolation trenches" between electrically active areas of the substrate.

One of the challenges of planarizing such oxide layer to the level of an underlying layer is the efficient removal of step height differences of the oxide layer, and of the overlying oxide layer, i.e., the "overfill", despite it varying in height across the surface of the substrate being polished. In the case of large step height and overfill, a reactive ion etching process (to reduce step height in the deposited dielectric material) is typically required as a prerequisite to conventional chemical-mechanical polishing with an abrasive slurry, to achieve satisfactory planarization. However, reactive ion etch processes are not desirable from the point of cost and/or process control. In addition, polishing with an abrasive slurry is prone to dishing, such that, in the process of removing features having step height differences and the overfill, some areas are overpolished to an extent that produces concave surfaces. Such is unsatisfactory in terms of achieving planarization of the surface being polished.

Some CMP methods which use fixed abrasive polishing pads rather than an abrasive slurry have been applied to the planarization of substrates having step height differences. However, where the step height difference is substantial, such fixed abrasive CMP methods are incapable of adequately removing the topography having step height differences and overfill without either overpolishing, or otherwise removing the overfill too slowly to be cost-effective. In such case, dishing of the oxide fill may result, or even scratching, ultimately producing an unsatisfactory surface. This deficiency has heretofore limited the use of such fixed abrasive CMP methods to structures having small, e.g., less than 200 Å variation in trench depth or oxide overfill across the substrate. In some fixed abrasive CMP methods, the material removal rate following the onset of planarization, i.e. after removing the features having step height differences, has often been unsatisfactorily low.

Thus, there is a need for an improved chemical mechanical polishing process capable of more rapidly planarizing an oxide material having step height differences and/or differences in overfill levels to produce a substantially planar surface having few scratches, while avoiding the need for RIE processing or other undesirable alternatives.

SUMMARY OF INVENTION

According to an aspect of the invention, a system and method of are provided of polishing a layer of a substrate. The method includes providing a polishing apparatus adapted to impart relative movement between a polishing pad and a substrate having a first layer to be polished; providing a liquid medium having a pH between 4 and 11 to an interface between the substrate and the polishing pad, the liquid medium including a pH controlling substance including at least one of an acid and a base, a carbonate and a stabilizer additive comprising at least one selected from the group consisting of amino acids and polyacrylic acid; and moving at least one of the substrate and the polishing pad relative to the other to polish the layer of the substrate.

According to a particular aspect of the invention, a chemical mechanical polishing method is provided for planarizing an oxide layer of a semiconductor substrate. According to such method, a semiconductor substrate is provided having an oxide layer having at least one of a step height difference and an uneven overfill above an underlying layer. The substrate is contacted with a fixed abrasive pad and a liquid medium is provided having a pH between about 9.5 and 12 to an interface between the substrate and the fixed abrasive pad, the liquid medium including a base selected from the group consisting of hydroxides of alkali earth metals, and ammonium hydroxide. The liquid medium also includes a carbonate and a stabilizer additive comprising an amino acid. The exposed oxide layer is polished by moving at least one of the substrate and the abrasive pad relative to the other of the substrate and the abrasive pad.

According to another aspect of the invention, a chemical mechanical polishing system is provided for planarizing a layer of a substrate. Such system includes a polishing member including a polishing pad for contacting a substrate, a chuck adapted to hold the substrate in movable contact with the polishing member, and a drive coupled to at least one of the polishing member and the chuck, adapted to impart relative motion between the polishing member and the chuck at an interface. The system further includes a liquid medium having a pH between about 4 and 11 provided to the interface, the liquid medium including a pH controlling substance, a carbonate, and a stabilizer additive including at least one selected from the group consisting of amino acids and polyacrylic acid.

DETAILED DESCRIPTION

The invention provides improved CMP methods and apparatus for planarization of a layer of a substrate having very small devices thereon. The processes of the invention may be used to polish layers of various materials, especially siliceous oxides in the fabrication of substrates including integrated circuit devices and/or other micro-sized devices, including, but not limited to micro-electromechanical devices (MEMs).

The processes of the invention are particularly suited to the planarization or removal of siliceous oxide materials, more especially silicon dioxide materials. An embodiment of the invention is particularly suited to the polishing of siliceous oxides, especially with the use of a fixed abrasive pad, even where the starting oxide layer has significant topographical variation, for example step height differences.

In a particular embodiment, the processes of the invention are applied to planarizing an overlying layer to the level of an underlying layer. For example, an oxide layer used to provide isolating features between active areas of a semiconductor substrate is deposited to fill trenches in the semiconductor layer of the substrate and then later planarized to the level of the underlying semiconductor layer. A particular embodiment of the invention will now be described relative to planarizing such oxide layer.

Typically, trench isolations, sometimes referred to as "isolation trenches," are formed by depositing a high density, seamless oxide fill material (e.g. by a high density plasma (HDP) technique) into a trench etched into the semiconductor substrate. In some integrated circuits, particularly DRAM circuits of the type including vertical transistor devices located within deep trenches, isolation trenches are required to have rather narrow diameters at or near the minimum lithographic feature size, for example, 110 nm and smaller, while having proportionally much greater depth, for example, from 0.5 µm to 2 µm or more, in order to isolate vertical transistors of closely situated trenches from electrical interaction.

Figure 1:
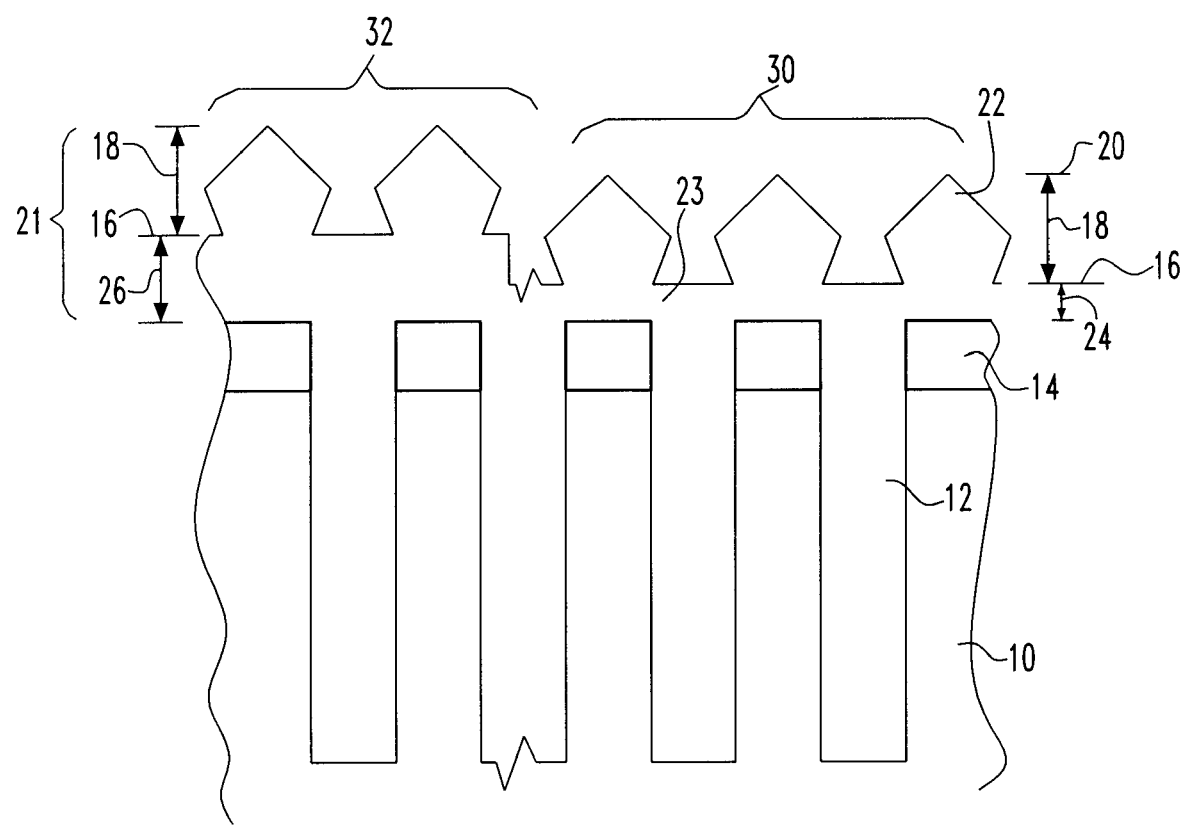
FIG. 1 is a cross section of an oxide layer to be planarized on a substrate, the layer exhibiting features having a step height difference and overfill.

The character of the HDP oxide fill, unlike conformal materials, is such that substantial differences in the height of topography result from the deposition. As illustrated in FIG. 1, isolation trenches 12, etched into a substrate 10 having an overlying pad layer 14 of a material such as silicon nitride, are filled with the HDP oxide material up to and above the pad layer 14. By the time the isolation trenches 12 are completely filled, the spaces between the trenches 12 becomes occupied by oxide "hats" 22 overlying the deposited dielectric material, resulting in a step height difference 18 between the oxide height 20 of the hats and the height 16 of the oxide fill above the trenches 12. As used herein, a "rough surface" is used to denote a surface having a step height difference in features.

In addition, because of nonuniformity of the oxide fill process and in the depth and width of trenches across the substrate 10, it is necessary to "overfill" the trenches 12 to a level 16 above the top of the pad layer 14, to assure that all trenches 12 are completely filled. The overfill level 16 above the level of the pad layer 14 can illustratively range from 500 Å to 3000 Å. For example, the height 24 of the overfill level above the pad layer 14 in one part 30 of the substrate 10 can be significantly less than the height 26 of the overfill 16 in another part 32 of the substrate 10.

In addition, the depth of isolation trenches 12 formed by the same process sequence may vary by 10% or more across a storage cell array. Moreover, since the area of such isolation trenches 12 is also subject to vary in relation to their position on a substrate within tolerances for lithographic mask patterning and subsequent etching of the substrate, variation in the volume that each trench 12 contains may become even larger than 10%. As a result, variations in the depth and area of trenches 12 at the surface of a substrate 10 affect the height of the overfill level 16 across the substrate 10, because of the resultant variation in the volume of deposited material that the trenches 12 hold.

Figure 2:
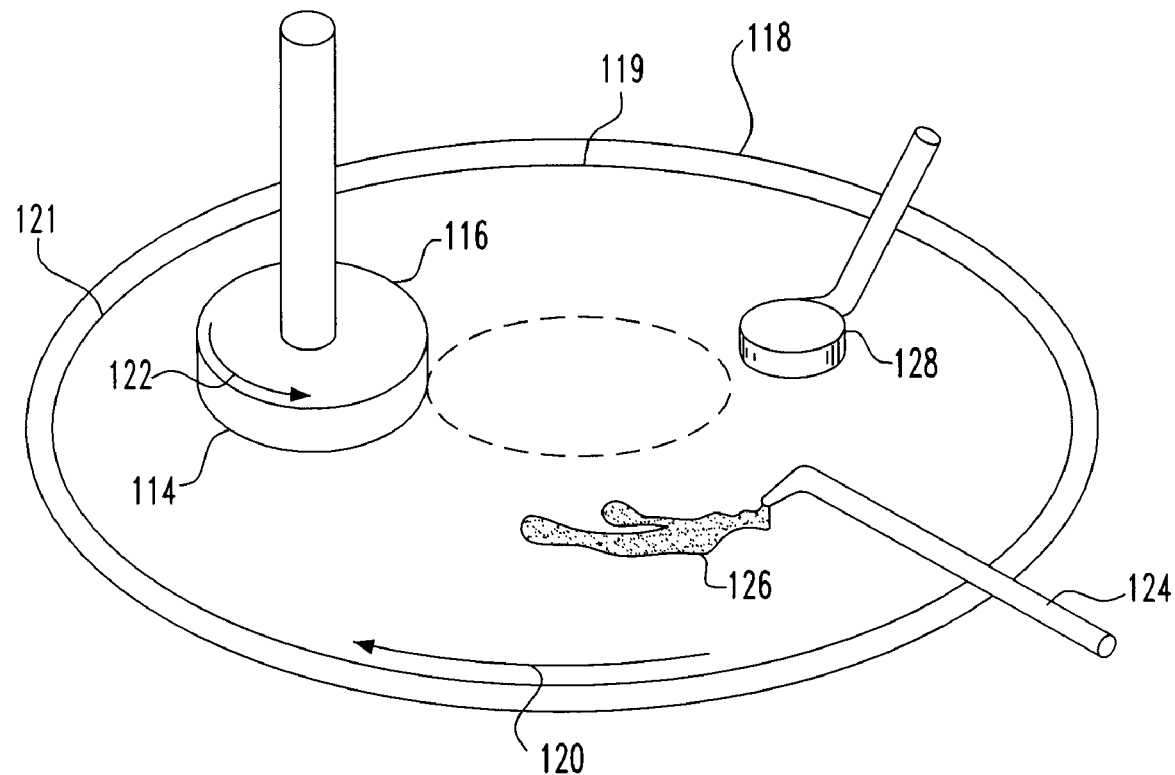
FIG. 2 illustrates a polishing apparatus of an embodiment of the invention.

As illustrated in FIG. 2, a polishing apparatus includes a polishing platen or table 118, over which a polishing pad 119 is placed. The polishing platen 118 is typically rotatable in a direction 120. Against the polishing pad 119 a wafer 114 is held by a wafer carrier 116 which may include an electrostatic or vacuum chuck for example. In an embodiment, the wafer carrier 116 itself may be rotatable in a direction 122 opposite that of the platen 118. The polishing apparatus includes a dispensing means 124 which dispenses a liquid medium 126 for assisting in the polishing operation. Additional apparatus 128 may be provided for such purposes as endpoint detection, cleaning of the pad 119, or spreading the liquid medium 126 over the pad 119.

In an embodiment, polishing is performed using a slurry having an abrasive component as the liquid medium 126, the liquid medium also including a carbonate and a pH controlling substance. The abrasive component preferably includes microfine particles of an oxide such as alumina, ceria or silica. A stabilizer additive is also preferably added, preferably being an amino acid such as, but not limited to L-proline, glycine or lysine when polishing an oxide in the presence of an alkaline liquid medium, or the stabilizer additive preferably being polyacrylic acid when polishing an oxide layer in the presence of an acidic medium. The rate of removing material from the surface being polished (hereinafter, "removal rate") and the density of scratches resulting from the polishing (hereinafter "scratch density") both become more uniform by the addition of such stabilizer additive.

The carbonate ($CO_3^=$) is provided in the slurry in an ionic concentration ranging between 0.005 and 0.25 percent by weight of the slurry, and more preferably between about 0.02 and 0.06 percent by weight of the slurry. Sources of the carbonate ion for a slurry include, but are not limited to soluble carbonate salts, slightly soluble carbonate salts, and some carbonate salts which are considered water insoluble but nevertheless can be incorporated into the slurry if provided in appropriately sized particles for inclusion in a colloidal suspension of the slurry. Soluble carbonate salts include sodium carbonate, potassium carbonate, cesium carbonate, and rubidium carbonate. Zinc carbonate is also soluble in a basic solution. Calcium carbonate, lithium carbonate and strontium carbonate are considered to be slightly soluble or of limited water solubility. Cerium carbonate and cerium carbonate hydrate are considered to be water insoluble but can be provided as appropriately sized particles in a colloidal suspension of the slurry.

In an exemplary embodiment, a liquid medium 126 is provided to a surface having an oxide layer to be polished by a polishing apparatus having a polishing pad 119 that includes a fixed abrasive component or a pad stack including a fixed abrasive pad. Fixed abrasive pads are commercially available, and may include, for example, a SWR-159 pad from 3M, Inc. Fixed abrasive pads are generally not employed with a slurry containing abrasive particles. Instead, fixed abrasive pads include particular abrasives which are released or exposed during the polishing process by the addition of, for example, a liquid medium 126 that does not contain abrasive particles.

Polishing with a fixed abrasive pad proceeds such that topography on the surface is removed preferentially over material on parts of the surface that are already somewhat planarized. The fixed abrasive pad is preferably hard, such that it deflects little over regions where trenches are formed such that very little if any dishing results of the oxide material in the trenches. In such case, polishing with a fixed abrasive pad is advantageous over polishing with an abrasive slurry in that topography is removed with little or no dishing.

In this embodiment, the liquid medium 126 is preferably mainly comprised of a solvent such as de-ionized water. The liquid medium 126 in this case can be called a "solution" since most, if not all, substances present in the medium are dissolved into it, there being no appreciable quantity of abrasive particles, as opposed to a slurry which is generally a suspension of abrasive particles. The liquid medium includes carbonate ions in a percentage by weight of the medium of 0.005 to 0.25, and more preferably between 0.02% to 0.06 wt. %. Preferably, potassium carbonate ($K_2CO_3$) is the source of carbonate ions in solution, particularly when the pH of the solution is adjusted to a basic level by potassium hydroxide (KOH).

The presence of the carbonate tends to reduce the scratch density and increase the removal rate. When polishing with a fixed abrasive pad, the presence of the carbonate in the liquid medium is observed to reduce the scratch density to a level comparable to polishing with an abrasive slurry. Moreover, the presence of the carbonate in the liquid medium is observed to increase the removal rate following the onset of planarization (i.e. after raised features 22 have been removed) to a level comparable to polishing with an abrasive slurry. Hence, the carbonate is a beneficial component of a liquid medium provided during the polishing operation.

A preferred way of providing the carbonate in the liquid medium is to add a carbonate salt thereto, for example a carbonate salt such as potassium carbonate ($K_2CO_3$), which can be provided in nonhydrated or hydrated form. Preferably, the percentage by weight of the carbonate salt added to the solution is between about 0.05% and 0.25%, and most preferably between about 0.05% and 0.15%. A pH controlling substance being a base such as potassium hydroxide (KOH) is added to the liquid medium, especially when the source of carbonate ions is potassium carbonate, such that the potassium carbonate buffers the potassium hydroxide. The potassium carbonate can be provided in either a hydrated or non-hydrated form. The base is added to the liquid medium until the liquid medium reaches a preferred range of pH between 9.5 and 12, and most preferably a pH of 10.5. Alternatively, carbonates of alkali earth metals other than potassium are suitable as sources of the carbonate in solution, including but not limited to carbonate salts which are soluble in water such as sodium carbonate ($Na_2CO_3$), sodium bicarbonate ($Na_4(CO_3)_2$), and the carbonates of cesium, and rubidium and zinc. Lithium carbonate ($Li_2CO_3$), and strontium carbonate ($SrCO_3$) although of limited solubility, can also be provided in the ionic concentrations stated herein.

Instead of potassium hydroxide, ammonium hydroxide ($NH_4OH$) can be used as an alternative base for adjusting the pH of the liquid medium to a desired value ranging between 9.5 and 12, and preferably about 10.5. A stabilizer additive, such as L-proline, glycine or lysine is provided as a component of the liquid medium in a range between about 0.5% and 7%, more preferably between about 0.5% and 5%, and most preferably between about 2.5% and about 3.5%.

Referring again to FIG. 1, a substrate 10 includes a dielectric layer 21 formed thereon. Layer 21 may include an oxide layer, such as a silicon dioxide layer. In one particularly useful embodiment, layer 21 includes an oxide formed by employing a high density plasma (HDP) oxide deposition process. Of course, other layers and materials may also be employed for layer 21. Layer 21 may include raised features 22 having a step height difference 18 overlying an overfill 23 which can vary in height, as shown at 24, 26, from one point to another on the substrate.

Polishing occurs by contacting the layer 21 to the polishing pad 119, and rotating the platen 118 while the pad 119 remains fixed to the platen 118, and/or rotating the wafer carrier 116, while the substrate 114 remains fixed to the wafer carrier 116. Referring to FIG. 1, polishing with a fixed abrasive pad may be considered as having two phases: for example, reducing topography having the step height difference 18, and polishing to eliminate the overfill 23.

Figure 3:
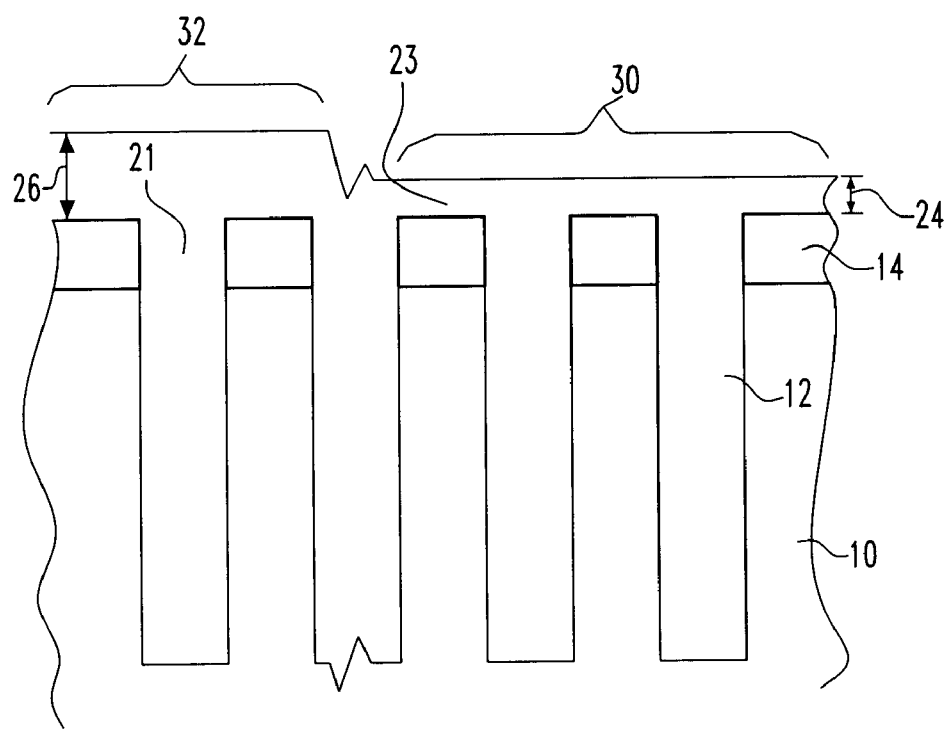
FIG. 3 illustrates a step in the planarization of the oxide layer illustrated in FIG. 1, after polishing to remove features having the step height difference.
Figure 4:
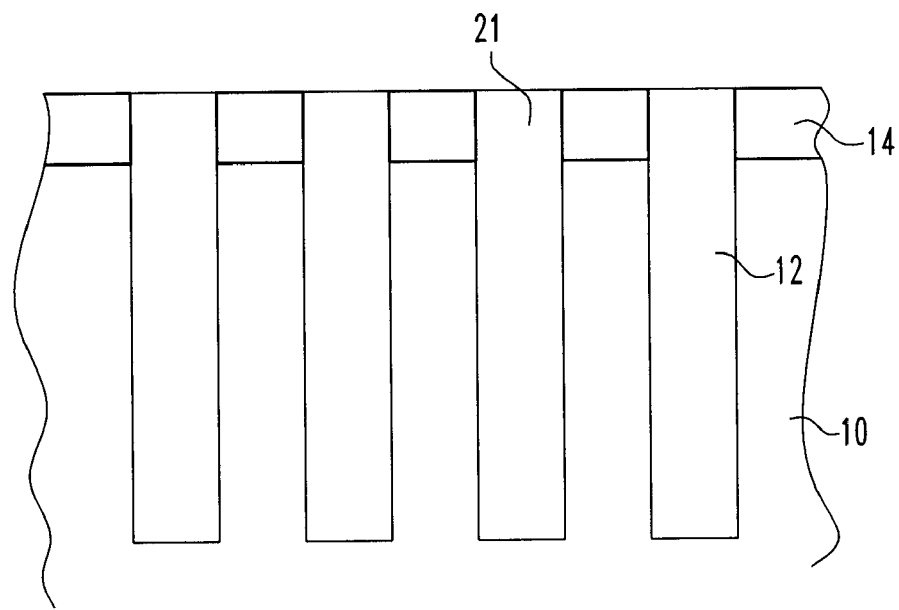
FIG. 4 illustrates a further step in the planarization of the oxide layer illustrated in FIG. 3, after further polishing to reveal an underlayer.

The phases are illustratively described with reference to FIGS. 3 and 4, respectively. As shown in FIG. 3, in an area 30 of the substrate 10, polishing with a fixed abrasive pad has succeeded in removing topography overlying the overfill level 24. Likewise, in another area 32 of the substrate 10 (which may, or may not necessarily be separated from area 30), topography has been removed which overlies the overfill level 26. However, overfill level 24 and overfill level 26 are not the same. Full planarization will not be achieved unless and until the overfill 23 having levels 24 and 26 in areas 30, 32, respectively, are removed to the level of the underlayer 14, while avoiding dishing of the oxide within trenches 12. Polishing with the fixed abrasive pad then continues, as shown in FIG. 4, until the overfill 23 is completely removed, leaving the oxide 21 only in trenches 12.

In an embodiment, polishing may be performed using a fixed abrasive pad having a linearly driven pad in the form of a web. In such process, the platen 118 linearly advances rather than rotates while the wafer carrier 116 moves in an orbital motion. Alternatively, after the substrate 114 is polished, the abrasive pad 119 advances (e.g., by about 0.5 inches to about 1 inch) to bring a new section of the abrasive pad for the next substrate to be polished.

While the invention has been described herein in accordance with certain preferred embodiments thereof, those skilled in the art will recognize the many modifications and enhancements which can be made without departing from the true scope and spirit of the present invention, limited only by the claims appended below.

The invention claimed is:

1. A method of polishing a layer of a substrate, comprising:
   providing a liquid medium having a pH between 4 and 12 to an interface between an oxide layer of a substrate and a fixed abrasive polishing pad, said liquid medium including a pH controlling substance including at least one of an acid and a base, said liquid medium further including a stabilizer additive including at least one acid selected from the group consisting of amino acids and polyacrylic acid, and a carbonate including carbonate ions having a concentration of between about 0.005% and about 0.25% by weight relative to said liquid medium; and
   polishing said first layer of said substrate by at least one of moving said substrate relative to said polishing pad or moving said polishing pad relative to said substrate to remove a first portion of said oxide layer with an efficient removal rate and to expose a surface of a second portion of said oxide layer underlying said first portion without substantially scratching said surface of said second portion.

2. The method of claim 1 wherein said pH controlling substance is an acid, said pH of said liquid medium ranges between about 4.2 and about 5, said stabilizer additive includes polyacrylic acid, and said first layer includes an oxide layer.

3. The method of claim 1, wherein said liquid medium has no appreciable quantity of abrasive particles when provided to said interface.

4. The method of claim 1 wherein said pH controlling substance is a base, and said stabilizer additive includes at least one amino acid, and said first layer includes an oxide layer.

5. The method of claim 4 wherein said stabilizer additive is selected from the group consisting of L-proline, glycine, lysine and polyacrylic acid.

6. The method of claim 1 wherein said fixed abrasive pad includes at least one of alumina or ceria.

7. The method of claim 6 wherein said polishing pad is moved in a linear direction relative to said substrate.

8. The method of claim 1 wherein said step of moving is performed to polish said first layer of said substrate until a second layer underlying said first layer is exposed.

9. The method of claim 8 wherein said first layer comprises an oxide of silicon, said second layer comprises silicon nitride and said step of moving is performed until said first layer is planarized to a level of said second layer.

10. The method of claim 1, wherein said fixed abrasive pad supplies at least substantially all of an abrasive component utilized during said polishing step.

11. The method of claim 10, wherein said removal rate is comparable to that which would be obtained if said abrasive component had been supplied substantially in said liquid medium.

12. The method of claim 1 wherein said pH controlling substance is a base, said pH is adjusted to a range between 9.5 and 12, and said stabilizer additive includes an amino acid.

13. The method of claim 12 wherein said base includes a hydroxide of an alkali earth metal.

14. The method of claim 12 wherein said base is selected from the group consisting of hydroxides of alkali earth metals and ammonium hydroxide.

15. The method of claim 14 wherein said carbonate includes a carbonate salt of said alkali earth metal.

16. The method of claim 15 wherein said base includes potassium hydroxide and said carbonate salt includes potassium carbonate.

17. The method of claim 15 wherein said carbonate is provided in said liquid medium by adding said carbonate salt to said liquid medium.

18. A chemical mechanical polishing method of planarizing an oxide layer of a semiconductor substrate, comprising:

providing a semiconductor substrate having an underlying layer and an exposed oxide layer covering said underlying layer, said oxide layer having a minimum thickness greater than about 200 angstroms at any point above said underlying layer;

contacting said exposed oxide layer of said substrate with a fixed abrasive pad;

providing a liquid medium having a pH between about 9.5 and 12 to an interface between said exposed oxide layer of said substrate and said fixed abrasive pad, said liquid medium including a base selected from the group consisting of hydroxides of alkali earth metals and ammonium hydroxide, said liquid medium further including a stabilizer additive comprising at least one acid selected from an amino acid and polyacrylic acid and a carbonate including carbonate ions having a concentration of between about 0.005% and about 0.25% by weight relative to said liquid medium; and polishing said exposed oxide layer by at least one of moving said substrate relative to said fixed abrasive pad or moving said fixed abrasive pad relative to said substrate to remove a first portion of said oxide layer with an efficient removal rate and to expose a surface of a second portion of said oxide layer underlying said first portion without substantially scratching said surface of said second portion.

19. The method of claim 18 wherein said stabilizer additive is selected from the group consisting of L-proline, glycine, lysine and polyacrylic acid.

20. The method of claim 19 wherein said second portion of said exposed oxide layer includes material formed in trenches within said underlying layer and said first portion includes material overlying said trenches, such that said polishing is performed to planarize said oxide layer until a surface of said underlying layer is exposed.

21. The method of claim 18, wherein said carbonate ions have a concentration of between about 0.02% and about 0.06% by weight relative to said liquid medium.

22. The method of claim 18, wherein said liquid carbonate ions have a concentration of between about 0.02% and about 0.06% by weight relative to said liquid medium.

23. The method of claim 18, wherein said minimum thickness of said oxide layer is at least about 500 angstroms.

* * * * *